(12) United States Patent
Onishi et al.

(10) Patent No.: US 9,876,293 B2
(45) Date of Patent: Jan. 23, 2018

(54) SEMICONDUCTOR DEVICE

(71) Applicant: FUJI ELECTRIC CO., LTD., Kawasaki-shi (JP)

(72) Inventors: Kazunaga Onishi, Matsumoto (JP); Rikihiro Maruyama, Matsumoto (JP); Wan Azha Bin Wan Mat, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/150,761

(22) Filed: May 10, 2016

(65) Prior Publication Data

US 2016/0380366 A1 Dec. 29, 2016

(30) Foreign Application Priority Data

Jun. 25, 2015 (JP) .................. 2015-128039

(51) Int. Cl.
| | |
|---|---|
| H01L 23/04 | (2006.01) |
| H01R 12/57 | (2011.01) |
| H01L 23/00 | (2006.01) |
| H01L 29/739 | (2006.01) |
| H01L 29/861 | (2006.01) |

(52) U.S. Cl.
CPC ............ H01R 12/57 (2013.01); H01L 24/46 (2013.01); H01L 29/7393 (2013.01); H01L 29/861 (2013.01); *H01L 2224/45124* (2013.01); *H01L 2224/45147* (2013.01); *H01L 2224/48091* (2013.01); *H01L 2224/49111* (2013.01)

(58) Field of Classification Search
CPC ...... H01R 12/57; H01R 24/46; H01R 29/861; H01R 29/7393; H01R 2224/49111; H01R 2224/48091; H01R 257/698; H01R 23/043; H01R 2224/1405
See application file for complete search history.

(56) References Cited

U.S. PATENT DOCUMENTS

| | | | |
|---|---|---|---|
| 5,108,308 A * | 4/1992 | Northcraft | ........... H01R 43/205 29/739 |
| 8,087,943 B2 | 1/2012 | Stolze | |
| 2009/0194884 A1 * | 8/2009 | Stolze | ................... H01L 25/072 257/773 |

FOREIGN PATENT DOCUMENTS

JP 2010-283107 12/2010

* cited by examiner

*Primary Examiner* — Julio J Maldonado
*Assistant Examiner* — Stanetta Isaac

(57) ABSTRACT

A semiconductor device having a tubular part is able to prevent the solder from spattering when soldering the tubular part. The semiconductor device has a insulated substrate that has a circuit layer on a front surface thereof, a tubular part that is soldered to the circuit layer, and an external terminal that is inserted into the tubular part and connected electrically to the tubular part. The tubular part has a cylinder portion and a flange portion that is connected to one longitudinal end of the cylinder portion. The flange portion has a first projection, a second projection and a third projection that face the circuit layer. The distance between the first projection and the second projection, the distance between the second projection and the third projection, and the distance between the third projection and the first projection each are greater than the inner diameter of the cylinder portion.

19 Claims, 12 Drawing Sheets

SEMICONDUCTOR DEVICE

CROSS-REFERENCE TO RELATED APPLICATIONS

This application is based on, and claims foreign priority to, Japanese Patent Application No. 2015-128039, filed Jun. 25, 2015, the content of which is incorporated herein by reference in its entirety.

BACKGROUND

1. Field

The present disclosure relates to a semiconductor device having a tubular part.

2. Description of Related Art

An example of a power semiconductor module of a semiconductor device has a insulated substrate with a circuit layer, a semiconductor chip connected electrically and mechanically to the circuit layer, and an external terminal connected electrically and mechanically to a region in the circuit layer, the same as or different from the region of the semiconductor chip. As a technique for connecting an external terminal to an insulated substrate stably, easily and inexpensively over a long period of time in order to cope with mechanical stress and vibrations, there has recently been proposed a power semiconductor module that uses a tubular part soldered to a circuit layer of a insulated substrate (U.S. Pat. No. 8,087,943).

SUMMARY

When soldering the tubular part of U.S. Pat. No. 8,087,943 by using a solder paste or a solder plate, in some cases the melted solder spatters, adheres and solidifies onto an inner surface of a cylinder portion of the tubular part. The solder solidified on the inner surface of the cylinder portion is likely to prevent the insertion of the external terminal, causing poor contact. Moreover, forcibly inserting the external terminal can break the external terminal or the tubular part.

The present disclosure was contrived in view of such circumstances, and an aspect thereof is to provide a semiconductor device having a tubular part, which is configured to be able to prevent the solder from spattering when soldering the tubular part.

In order to achieve the foregoing aspect, the following semiconductor device is provided as an embodiment. The semiconductor device has a insulated substrate that has a circuit layer on a front surface thereof, a tubular part that is soldered to the circuit layer, and an external terminal that is inserted into the tubular part and connected electrically to the tubular part. The tubular part has a cylinder portion and a flange portion that is connected to one longitudinal end of the cylinder portion. The flange portion has a first projection, a second projection, and a third projection that face the circuit layer. The distance between the first projection and the second projection, the distance between the second projection and the third projection, and the distance between the third projection and the first projection each are greater than the inner diameter of the cylinder portion.

According to embodiments of the present disclosure providing a semiconductor device having a tubular part, solder can be prevented from spattering when soldering the tubular part.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS (Embodiment 1)

Embodiments of a semiconductor device according to the present disclosure are described specifically with reference to the drawings.

Figure 1:
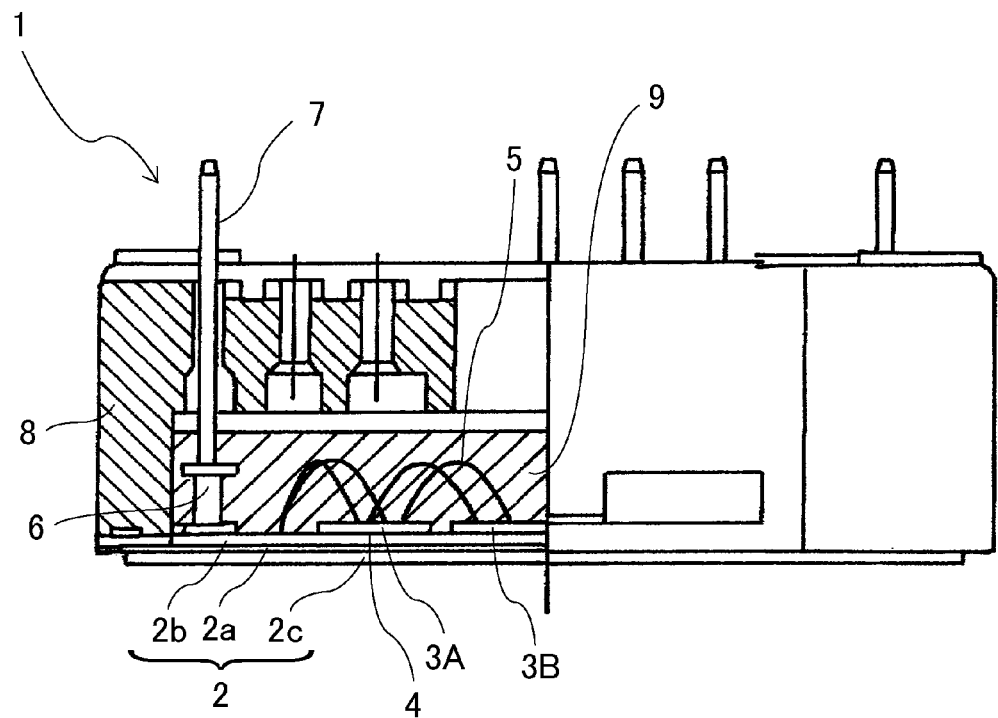
FIG. 1 is a front view showing a partial cross section of an example of a semiconductor module produced by a production method of the present disclosure.
Figure 2:
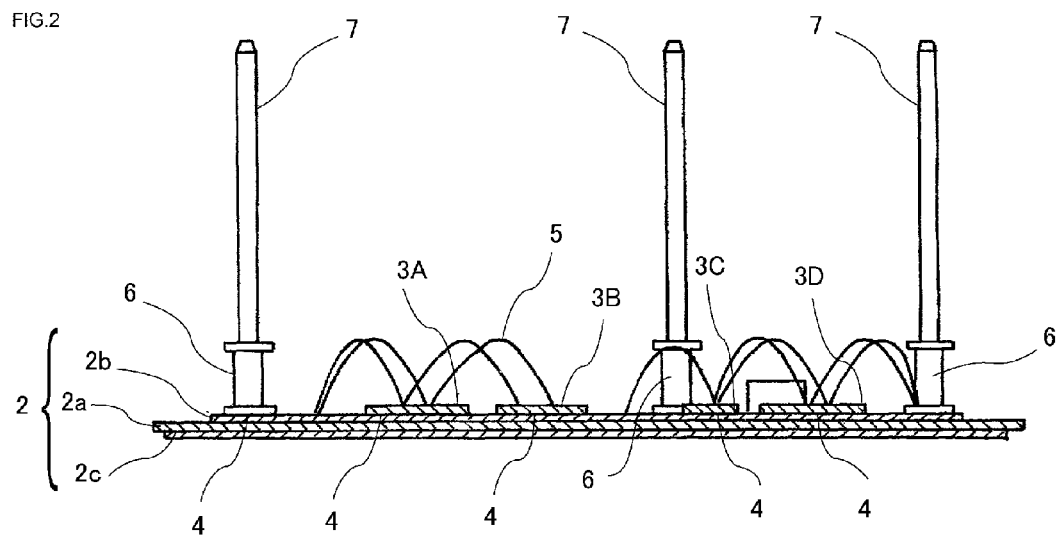
FIG. 2 is an enlarged cross-sectional diagram showing the principal portions of the semiconductor module of FIG. 1.

FIG. 1 is a half sectional view of an example of a power semiconductor module 1, an embodiment of the semiconductor device according to the present disclosure. FIG. 2 is an enlarged cross-sectional diagram showing the principal portions of the power semiconductor module 1 of FIG. 1.

The power semiconductor module 1 has an insulated substrate 2 that has a circuit layer 2b on the front surface thereof, a tubular part 6 that is soldered to the circuit layer 2b, and an external terminal 7 that is inserted into the tubular part 6 and connected electrically to the tubular part 6. At least one semiconductor element is mounted on the insulated substrate 2. In the illustrated embodiment, four semiconductor chips 3A, 3B, 3C and 3D are mounted. The semiconductor chips 3A, 3B, 3C and 3D can be, for example, insulated gate bipolar transistor (IGBT) chips or free wheeling diode (FWD) chips. MOSFET chips may be used in place of the IGBT chips, and RC-IGBT chips may be used in place of the IGBT chips and FWD chips. The insulated substrate 2 is configured by stacking an insulating plate 2a made of insulating ceramic such as aluminum oxide, aluminum nitride, or silicon nitride, the circuit layer 2b that is disposed on the front surface of the insulating plate 2a in which a conductor made of copper foil or aluminum foil is selectively formed to configure a circuit, and a metal layer 2c that is disposed on the rear surface of the insulating plate 2a and made of copper foil or aluminum foil. A direct copper bond (DCB) substrate configured by directly bonding the insulating plate 2a, the circuit layer 2b and the metal layer 2c or an active metal bonding (AMB) substrate can be used as the insulated substrate 2.

The semiconductor chips 3A, 3B, 3C and 3D each have electrodes on the front and rear surfaces thereof. The electrodes on the rear surfaces are connected electrically and mechanically to the circuit layer 2b by solder 4, and the electrodes on the front surfaces are connected electrically to the circuit layer 2b by bonding wires or lead frames 5 made of copper, aluminum or the like.

The tubular part 6 is bonded to the circuit layer 2b of the insulated substrate 2 by the solder 4. The tubular part 6 is made of a conductive material such copper. One end portion of the external terminal 7 is inserted into the tubular part 6 and fixed therein.

The insulated substrate 2 in which the semiconductor chips 3A, 3B, 3C and 3D are bonded electrically and mechanically to the circuit layer 2b, the tubular part 6 is bonded, and the bonding wires 5 are connected, is housed in a case 8. The case 8 has a lower end thereof adhered and fixed to a rim portion of the insulated substrate 2 by an adhesive (not shown). A space on the inside of an upper lid portion of the case 8 is filled with a gel 9, sealing the inside of the case 8. Another end portion of the external terminal 7 protrudes from the case 8.

Figure 3:
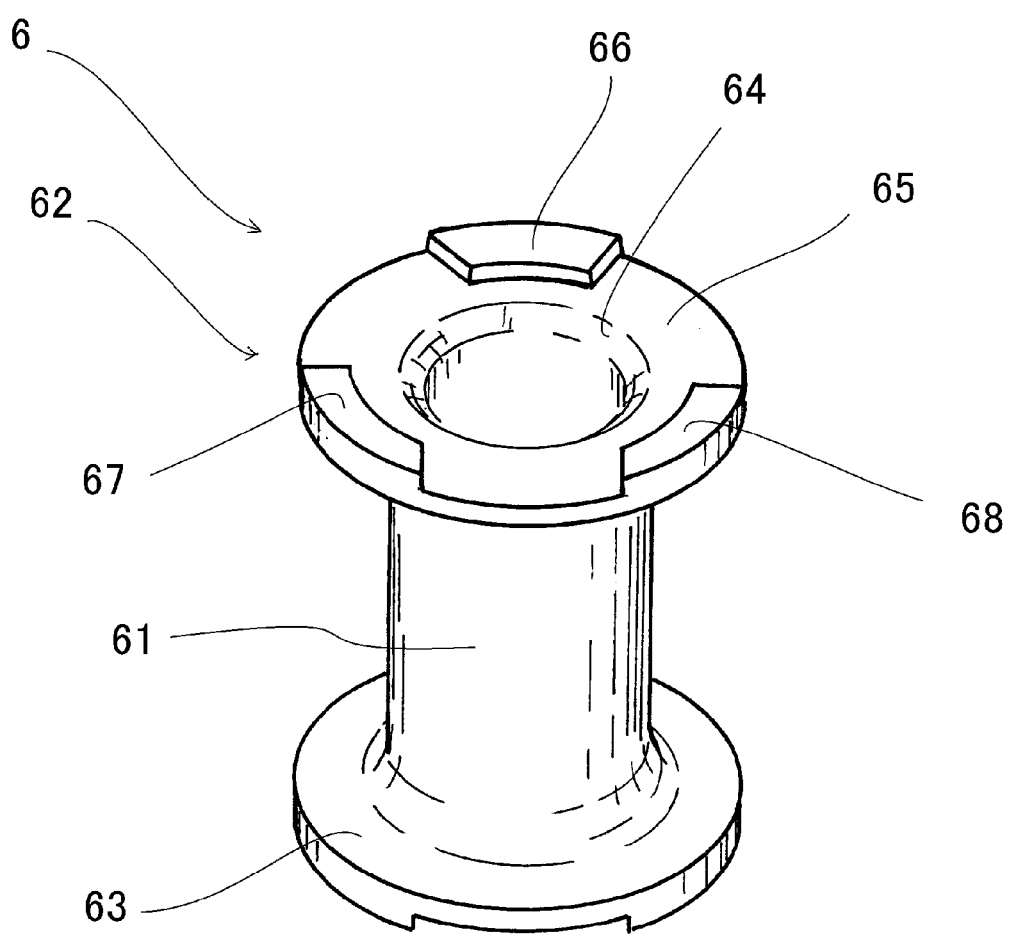
FIG. 3 is a perspective view of a tubular part.

As shown in the perspective view of FIG. 3, the tubular part 6 has a hollow cylinder portion 61, a first flange portion 62 connected to one longitudinal end of the cylinder portion 61, and a second flange portion 63 connected to the other longitudinal end. In the tubular part 6 shown in FIG. 3, the first flange portion 62 and the second flange portion 63 are of the same shape. Thus, the first flange portion 62 is mainly described as a flange portion of the tubular part 6.

The first flange portion 62 faces the circuit layer 2b. The first flange portion 62 has on the inner circumferential side thereof a curved surface portion 64 connected to the cylinder portion 61, and has, on the outer circumferential side thereof, a flat portion 65 connected to the curved surface portion 64. The first flange portion 62 further has a first projection 66, a second projection 67, and a third projection 68, which project from the flat portion 65 in such a manner as to face the circuit layer 2b. The heights of the first projection 66, the second projection 67 and the third projection 68 from the front surface of the flat portion 65 are set such that the first projection 66, the second projection 67 and the third projection 68 are positioned close to the circuit layer 2b when the first flange portion 62 is soldered to the circuit layer 2b, and a sufficient solder thickness is thereby secured between the flat portion 65 and the circuit layer 2b.

As will be described hereinafter in detail with reference to FIG. 6, the first projection 66, the second projection 67 and the third projection 68 are disposed such that the distance L1 between the first projection 66 and the second projection 67, the distance L2 between the second projection 67 and the third projection 68, and the distance L3 between the third projection 68 and the first projection 66 each are greater than the inner diameter D of the cylinder portion 61. The first projection 66, the second projection 67 and the third projection 68 are disposed on the flat portion 65 in such a manner as to be in contact with the outer circumference of the first flange portion 62, but are not disposed on the curved surface portion 64.

The tubular part 6 is soldered to the circuit layer 2b and fixed, wherein the first flange portion 62 faces the circuit layer 2b and the central axis of the cylinder portion 61 is perpendicular to the circuit layer 2b. The first projection 66, the second projection 67 and the third projection 68 are brought close to the circuit layer 2b, and the flat portion 65 secures solder thickness with the circuit layer 2b. The flat portion 65 also configures a discharge path for discharging the flux of the solder paste or the gas of the solder plate when soldering the cylinder portion 61. A principal surface of the flat portion 65 may be orthogonal to the central axis of the cylinder portion 61 or parallel to a principal surface of the circuit layer 2b.

Figure 4:
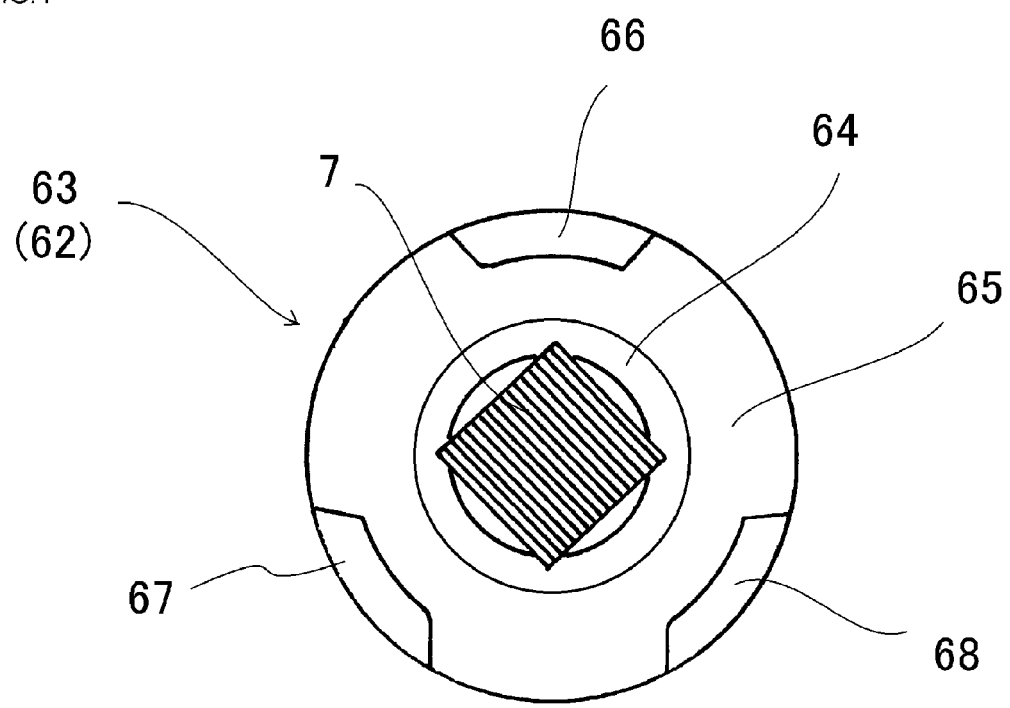
FIG. 4 is a plan view showing an external terminal inserted into the tubular part.

The external terminal 7 is inserted and fixed to the soldered cylinder portion 61 of the tubular part 6. As shown in the plan view of the tubular part 6 in FIG. 4, the external terminal 7 has a polygonal cross-sectional shape such as a square cross-sectional shape, a diagonal line of which is slightly longer than the inner diameter of the cylinder portion 61. The external terminal 7 may also have a non-circular cross-sectional shape. By deforming the cylinder portion 61 slightly plastically, or in other words, swaging the cylinder portion 61 at the corners of the external terminal 7 when inserting the external terminal 7 into the tubular part 6, the external terminal 7 can be connected to the tubular part 6 more reliably.

Figure 5:
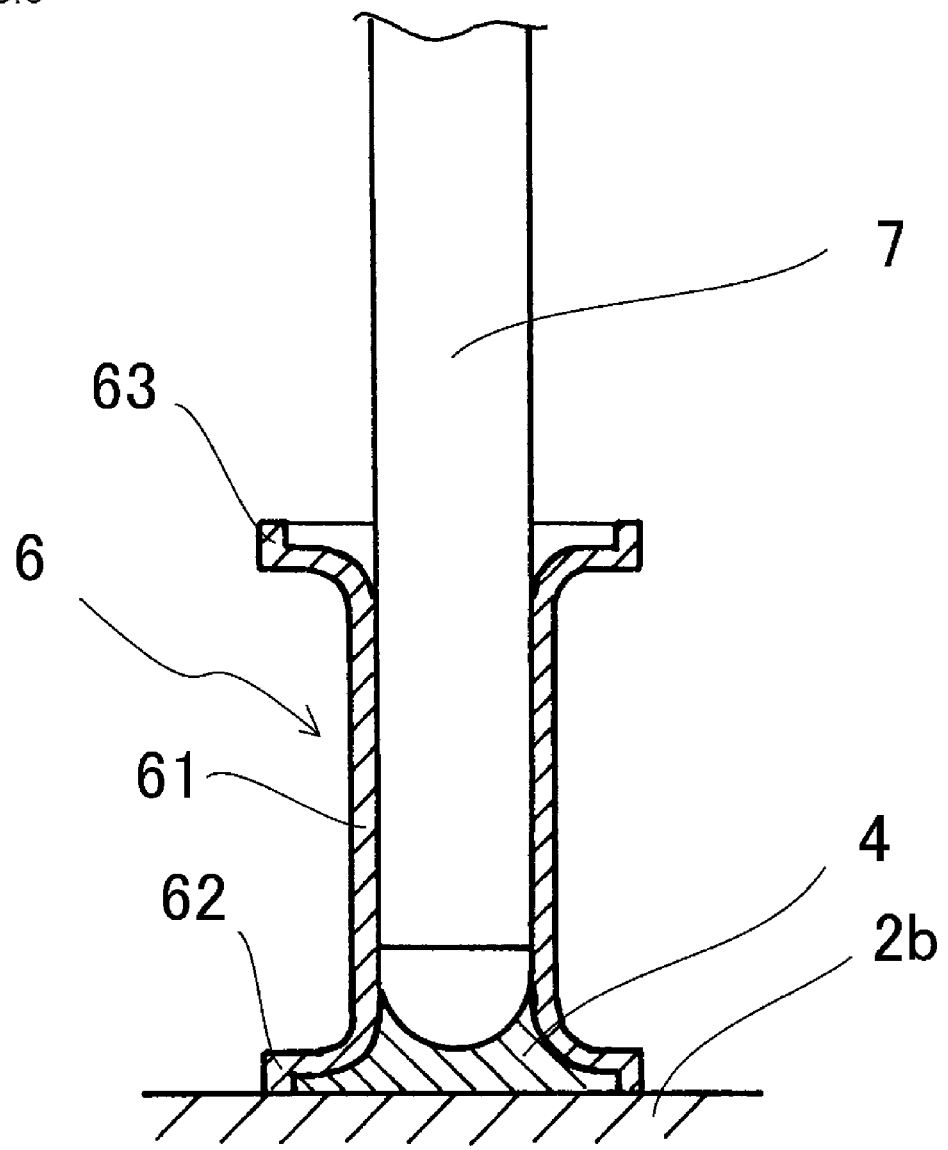
FIG. 5 is a cross-sectional diagram of the tubular part into which the external terminal is inserted.

FIG. 5 shows a cross-sectional diagram of the tubular part 6 into which the external terminal 7 is inserted. The circuit layer 2b and the first flange portion 62 are connected electrically and mechanically to each other by interposing the solder 4 therebetween.

Figure 6:
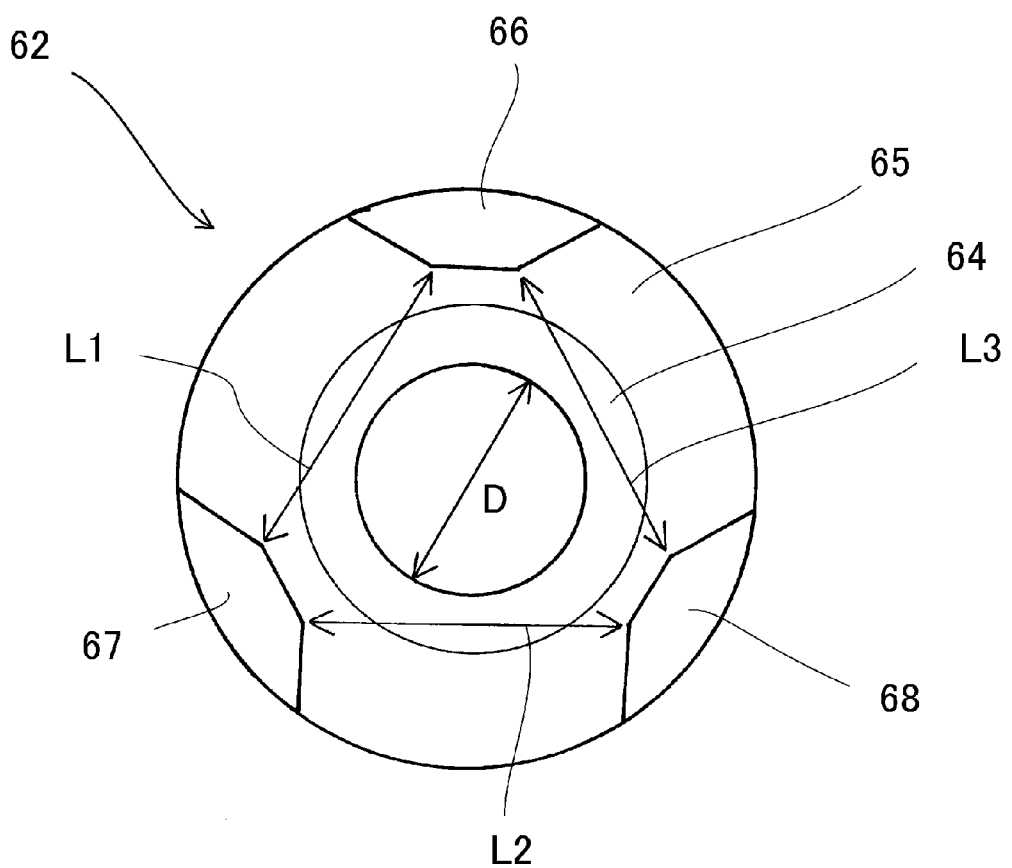
FIG. 6 is a plan view of a first flange portion of the tubular part.

FIG. 6 shows a plan view of the first flange portion 62 and the tubular part 6. The distance L1 between the first projection 66 and the second projection 67, the distance L2 between the second projection 67 and the third projection 68, and the distance L3 between the third projection 68 and the first projection 66 each are greater than the inner diameter D of the cylinder portion 61. In the plan view showing the first flange portion 62, the distance L1 corresponds to the shortest distance of the line segment connecting one point on the contour of the first projection 66 and one point on the contour of the second projection 67. Similarly, in the plan view of the first flange portion 62, the distance L2 corresponds to the shortest distance of the line segment connecting one point on the contour of the second projection 67 and one point on the contour of the third projection 68. Furthermore, in the plan view of the first flange portion 62, the distance L3 corresponds to the shortest distance of the line segment connecting one point on the contour of the third projection 68 and one point on the contour of the first projection 66.

Making the distances L1, L2 and L3 greater than the inner diameter D of the cylinder portion 61 can prevent the solder from spattering when soldering the tubular part. The reason is as follows.

Because the first to third projections 66 through 68 are brought close to the circuit layer 2b at the time of soldering the tubular part, the flux or gas flows to the outside of the first flange portion 62 or to the cylinder portion 61 through the flat portion 65 when bonding the circuit layer 2b and the first flange portion 62 to each other. Consequently, the shapes of the flat portion 65 and of the first to third projections 66 through 68 of the first flange portion 62 have an impact on the flow of the flux or gas at the time of soldering.

Figure 12:
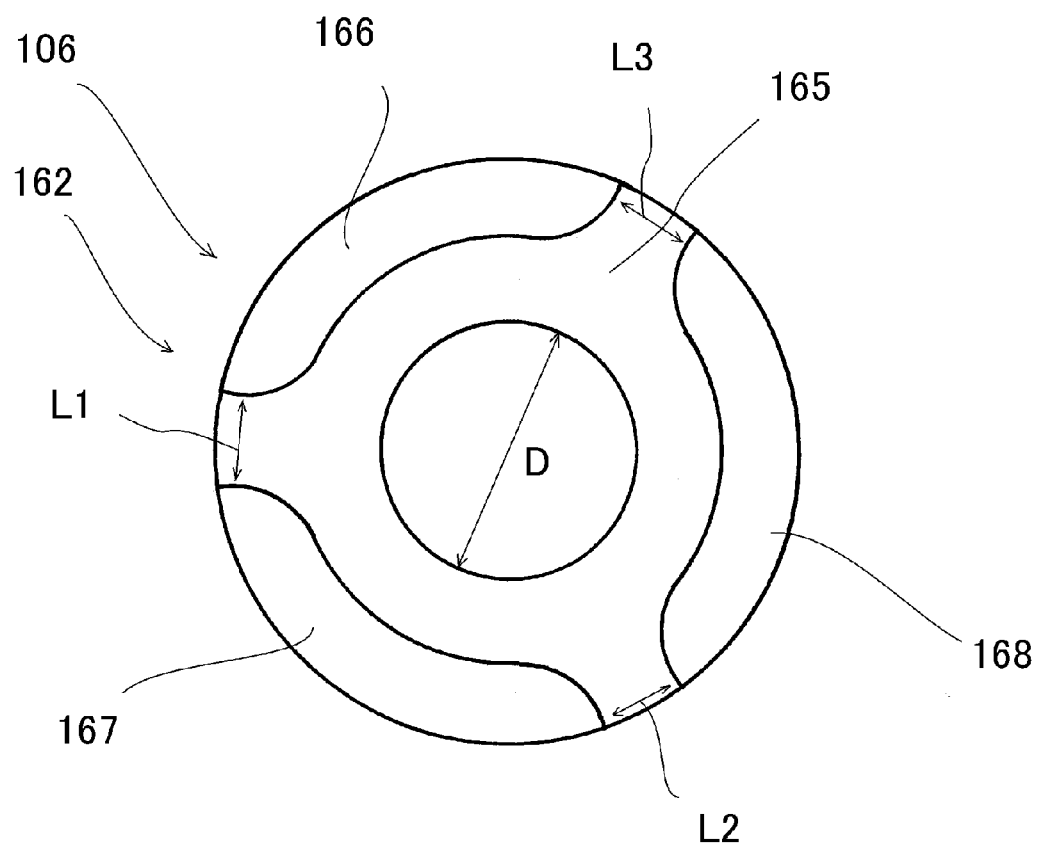
FIG. 12 is a plan view of a flange portion of a conventional tubular part.
Figure 13A:
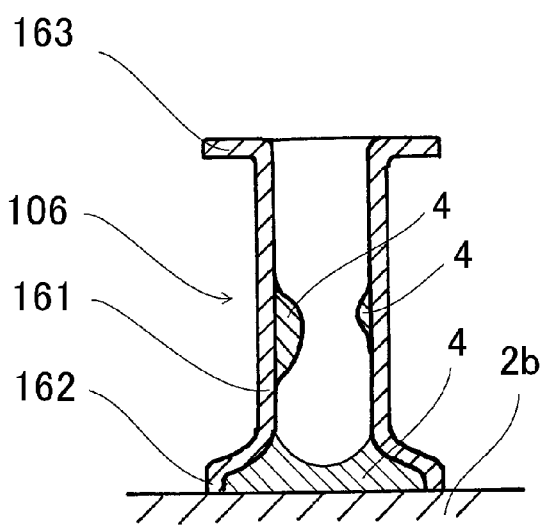
FIG. 13A is a cross-sectional diagram of the tubular part shown in FIG. 12.
Figure 13B:
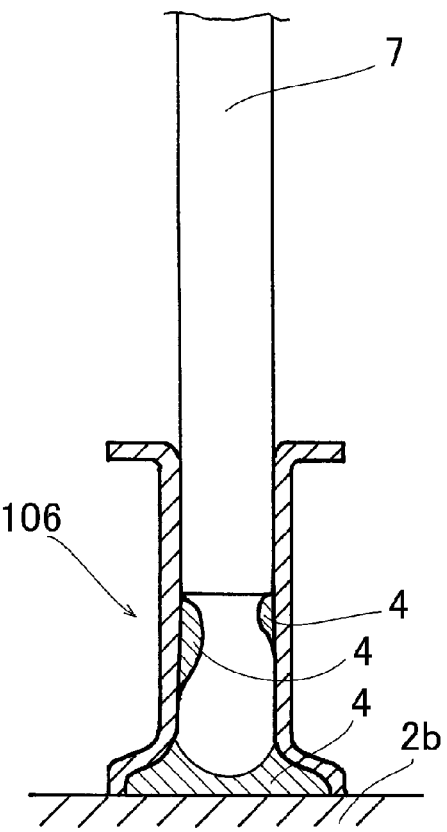
FIG. 13B is a cross-sectional diagram of the tubular part shown in FIG. 12 into which an external terminal is inserted.

As shown in the plan view of a flange portion in FIG. 12, a tubular part 106 shown in FIG. 1 of U.S. Pat. No. 8,087,943 has three arc-shaped projections 166, 167 and 168 that are disposed on a flat portion 165 of a flange portion 162 along the outer circumference of the flange portion 162. The distance L1 between the projection 166 and the projection 167, the distance L2 between the projection 167 and the projection 168, and a distance L3 between the projection 168 and the projection 166 each are smaller than the inner diameter D. In the tubular part 106 that has the flange portion 162 with such projections 166, 167 and 168, the distances L1, L2 and L3, which correspond to the widths of the flat parts between the adjacent projections, are short, limiting the amount of flux or gas flowing from the outer circumference of the flange portion 162 to the outside thereof at the time of soldering, and causing the flux or gas to flow mainly to a cylinder portion 161. Therefore, most of the flux or gas is discharged to a hollow portion of the cylinder portion 161 through the solder melted at an end portion of the cylinder portion 161. Because the gas pressure at this moment is high, the solder that is melted at the end portion of the cylinder portion 161 spatters as the flux or gas is discharged, and consequently adheres and sticks to an inner surface of the cylinder portion 161. FIG. 13A is a cross-sectional diagram of the tubular part 106, and FIG. 13B is a cross-sectional diagram of the tubular part 106 into which the external terminal 7 is inserted. The tubular part 106 has the flange portion 162 connected to one longitudinal end of the cylinder portion 161 and a flange portion 163 to the other longitudinal end. In the tubular part 106, the solder 4 spatters to the inner surface of the cylinder portion 161, inhibiting the insertion of the external terminal 7.

Figure 9:
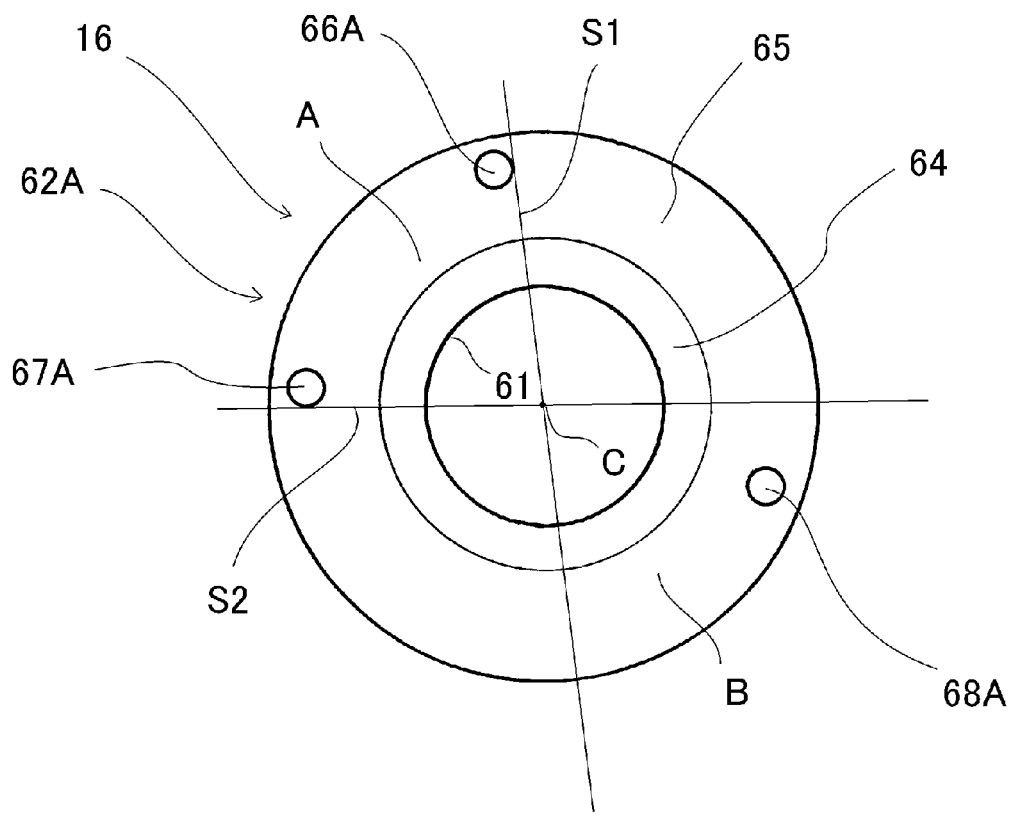
FIG. 9 is a plan view of the first flange portion of the tubular part shown in FIG. 8.

The tubular part that is illustrated in FIG. 9 of U.S. Pat. No. 8,087,943 as an embodiment has three, roughly square projections that are disposed in a radial manner in the flange portion. These three projections are disposed in such a manner that the distances between the adjacent projections are greater than the tubular part shown in FIG. 12 but smaller than the inner diameter. In addition, because the projections are disposed in a radial manner in a length from the outer circumference of the flange portion to the vicinity of the inner circumference of the same, it is difficult to perform the bending work for forming the flange portion or press work for forming the projections in manufacturing the tubular part. Such a difficulty is likely to reduce the yield or increase the costs.

In the tubular part 6 of the embodiment shown in FIG. 6, on the other hand, because the foregoing distances L1, L2 and L3 each are greater than the inner diameter D of the cylinder portion 61, a large amount of flux or gas flows from the outer circumference of the flange portion to the outside at the time of soldering the tubular part. Therefore, the pressure of the flux or gas discharged to the hollow portion of the cylinder portion is low, and the solder that is melted at the end portion of the cylinder portion can be prevented from spattering at the same time as when the flux or gas is discharged.

In addition, the first projection 66, the second projection 67 and the third projection 68 of the tubular part 6 are not disposed in the curved surface portion 64 of the first flange portion 62 but are disposed only in the flat portion 65, in such a manner as to be in contact with the outer circumference of the flat portion 65, i.e., the outer circumference of the first flange portion 62. Such a configuration in which the first projection 66, the second projection 67 and the third projection 68 are not disposed in the curved surface portion 64 of the first flange portion 62 can facilitate the bending work for forming the flange portion and the press work for forming the projections. This can result in an improvement in the yield and a reduction of the costs. Moreover, great stability can be attained in disposing the tubular part 6 on the circuit layer 2b using a jig prior to bonding these parts together.

More specifically, in the tubular part 6 shown in FIG. 6, the first projection 66, the second projection 67, and the third projection 68 are disposed on the first flange portion 62 so as to be in rotational symmetry with respect to the central axis of the cylinder portion 61. Such a configuration can facilitate designing and production of a press mold used for forming the projections and attain stability in placing the tubular part 6 on the circuit layer 2b using a jig prior to bonding these parts together.

The first projection 66, the second projection 67 and the third projection 68 of the tubular part 6 are of the same shape. Forming these projections into the same shape can facilitate designing and production of a press mold used for forming these projections.

Figure 7:
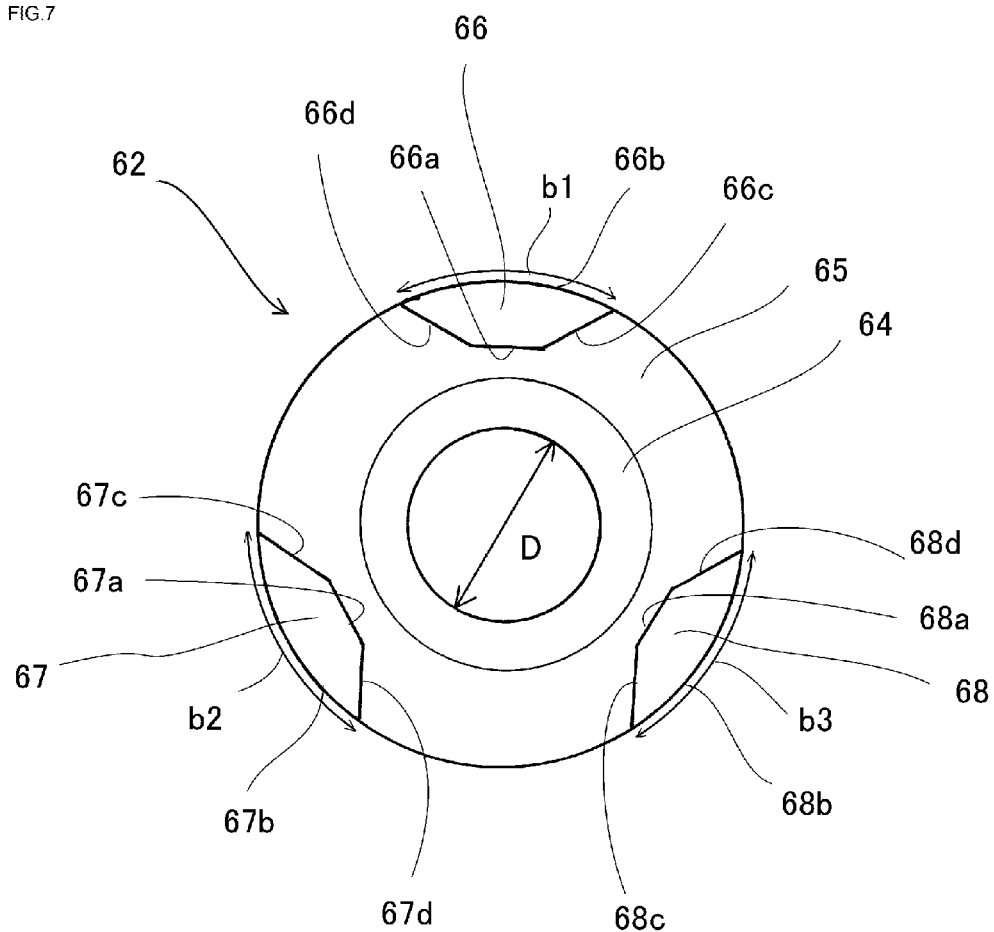
FIG. 7 is a plan view of the first flange portion of the tubular part shown in FIG. 6.

More specifically, when seen in the direction of the central axis of the cylinder portion 61 as shown in the plan view of the first flange portion 62 in FIG. 7, the first projection 66, the second projection 67 and the third projection 68 of the tubular part 6 have rough (substantially) isosceles trapezoidal outlines having arcs or line segments 66a, 67a and 68a on the inner circumferential side of the first flange portion 62 as the upper bases and arcs 66b, 67b and 68b on the outer circumferential side of the same as the lower bases. A leg 66d of the first projection 66 that faces the second projection 67 and a leg 67c of the second projection 67 that faces the first projection 66 are substantially parallel to each other. Similarly, a leg 67d of the second projection 67 that faces the third projection 68 and a leg 68c of the third projection 68 that faces the second projection 67 are substantially parallel to each other. A leg 68d of the third projection 68 that faces the first projection 66 and a leg 66c of the first projection 66 that faces the third projection 68 are substantially parallel to each other. Such a configuration in which the outlines of the first projection 66, the second projection 67 and the third projection 68 of the tubular part 6 are the rough isosceles trapezoids in which the legs of the projections facing each other are substantially parallel to each other, can allow the flux or gas to flow from the outer circumference of the first flange portion 62 to the outside thereof at the time of soldering, preventing the solder from spattering to the inner surface of the cylinder portion 61. Such a configuration can also facilitate designing and production of a press mold used for forming the first projection 66, the second projection 67 and the third projection 68 through press work and contribute to improve the outlines of the rough isosceles trapezoids by using the press mold.

It is preferred that the lengths b1, b2 and b3 of the arcs 66b, 67b and 68b on the outer circumferential side of the flange portion that are formed as the lower bases of the first projection 66, the second projection 67 and the third projection 68 in a rough isosceles trapezoidal shape be equal to or greater than 0.1 times the inner diameter D of the cylinder portion 61 but equal to or less than twice the inner diameter D. When the lengths b1, b2 and b3 are equal to or greater than 0.1 times the inner diameter D but equal to or less than twice the inner diameter D, excellent discharge efficiency of the flux or gas and excellent supportiveness of the tubular part can be accomplished.

(Embodiment 2)

Figure 8:
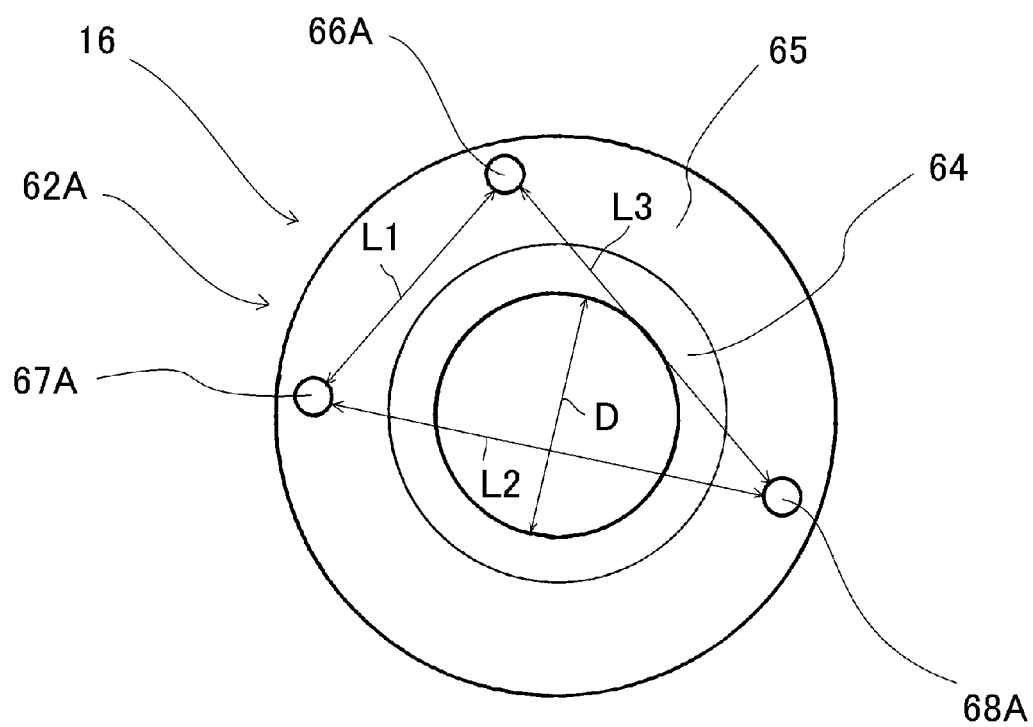
FIG. 8 is a plan view of a first flange portion of another tubular part.

A power semiconductor module according to Embodiment 2 of the present disclosure is different from the above-described power semiconductor module of Embodiment 1 in terms of the tubular part. Therefore, a characteristic tubular part is described hereinafter. FIG. 8 is a plan view of a flange portion of a tubular part of the present embodiment. The members of the tubular part shown in FIG. 8 that are same as the members of the tubular part 6 shown in FIG. 6 are given the same reference numerals, and the overlapping descriptions are omitted accordingly.

A tubular part 16 shown in FIG. 8 has three projections in a first flange portion 62A: a first projection 66A, a second projection 67A, and a third projection 68A. The shape, size and arrangement of the first projection 66A, the second projection 67A and the third projection 68A are different from those of the first projection 66, the second projection 67 and the third projection 68 of the tubular part 6 shown in FIG. 6. The first projection 66A, the second projection 67A and the third projection 68A are formed in the shape of a circle. The distance L1 between the first projection 66A and the second projection 67A, the distance L2 between the second projection 67A and the third projection 68A, and the distance L3 between the third projection 68A and the first projection 66A each are greater than the inner diameter D of the cylinder portion 61. Making the distances L1, L2 and L3 greater than the inner diameter D of the cylinder portion 61 can prevent the solder from spattering when soldering the tubular part.

The first projection 66A, the second projection 67A and the third projection 68A are not disposed in the curved surface portion 64 of the first flange portion 62A but are disposed only in the flat portion 65 and between an inner circumferential end and an outer circumferential end of the flat portion 65 of the first flange portion 62A. Such a configuration in which the first projection 66A, the second projection 67A and the third projection 68A are not disposed in the curved surface portion 64 of the first flange portion 62A can facilitate the bending work for forming the flange portion and the press work for forming the projections. This can result in an improvement in the yield and a reduction of the costs.

The arrangement of the first projection 66A, the second projection 67A and the third projection 68A on the first flange portion 62A is now described more specifically with reference to FIG. 9. A line segment that passes through the central axis C of the cylinder portion 61 and comes into contact with a point on the outline of the first projection 66A that is away from the second projection 67A is taken as a first line segment S1. A line segment that passes through the central axis C of the cylinder portion 61 and comes into contact with a point on the outline of the second projection 67A that is away from the first projection 66A is taken as a second line segment S2. The first line segment S1 is in contact with a point on the contour of the first projection 66A, and the second line segment S2 is in contact with a point on the contour of the second projection 67A. The first projection 66A and the second projection 67A are disposed in a region A sandwiched between the first line segment S1 and the second line segment S2. The third projection 68A is disposed in a region B that is sandwiched between the first line segment S1 and the second line segment S2 at the opposite side of the region A with the central axis C of the cylinder portion 61 therebetween. The regions A and B are located on the first flange portion 62A.

The first projection 66A, the second projection 67A and the third projection 68A of the tubular part 16 shown in FIG. 9 are not in rotational symmetry with respect to the central axis C of the cylinder portion 61. Because the first projection 66A and the second projection 67A are disposed in the region A and the third projection 68A is disposed in the region B, the tubular part 16 can be supported by the three points of the first projection 66A, the second projection 67A and the third projection 68A when the tubular part 16 is disposed on the circuit layer 2b using a jig prior to be bonded, improving the stability.

The first projection 66A, the second projection 67A and the third projection 68A of the tubular part 16 are in the same size. Needless to say, the size of one of the three projections may be different from those of the other two, or all the three projections may be in different sizes.

The first projection 66A, the second projection 67A and the third projection 68A have the same circular outline. Forming these projection into this same shape can facilitate designing and production of a press mold used for forming these projections. The outline of these projections is not limited to a circular shape; thus, the projections may have any other outline such as a square outline. In addition, the shape of one of the three projections may be different from those of the other two, or all the three projections may be in different shapes.

(Embodiment 3)

Figure 10:
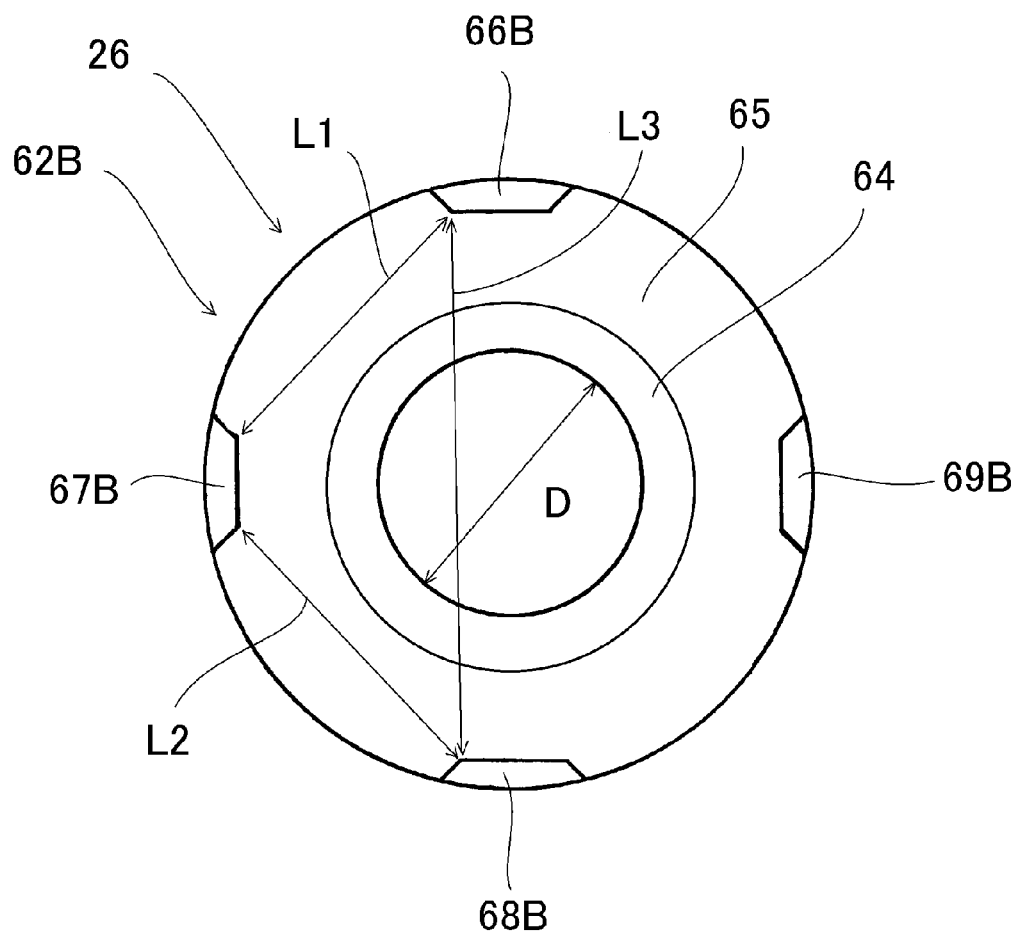
FIG. 10 is a plan view of a first flange portion of another tubular part.

A power semiconductor module of Embodiment 3 of the present disclosure is different from the above-described power semiconductor module of Embodiment 1 in terms of the tubular part. Therefore, a characteristic tubular part is described hereinafter. FIG. 10 is a plan view of a flange portion of a tubular part of the present embodiment. The members of the tubular part shown in FIG. 10 that are same as the members of the tubular part 6 shown in FIG. 6 are given the same reference numerals, and the overlapping descriptions are omitted accordingly.

FIG. 10 shows an example in which a tubular part 26 has first to nth projections (n is an integer equal to or greater than 4) in a first flange portion 62B. In this illustrated example, n is specifically 4.

The first flange portion 62B has a first projection 66B, a second projection 67B, a third projection 68B, and a fourth projection 69B. These projections each are roughly in the shape of a square. The distance L1 between the first projection 66B and the second projection 67B, the distance L2 between the second projection 67B and the third projection 68B, and the distance L3 between the third projection 68B and the first projection 66B each are greater than the inner diameter D of the cylinder portion 61. Making the distances L1, L2 and L3 greater than the inner diameter D of the cylinder portion 61 can prevent the solder from spattering when soldering the tubular part.

The first projection 66B, the second projection 67B, the third projection 68B, and the fourth projection 69B are not disposed in the curved surface portion 64 of the first flange portion 62B but are disposed only in the flat portion 65 in such a manner as to be in contact with the outer circumference of the flat portion 65, i.e., the outer circumference of the first flange portion 62B. Such a configuration in which the first projection 66B, the second projection 67B, the third projection 68B, and the fourth projection 69B are not disposed in the curved surface portion 64 of the first flange portion 62B can facilitate the bending work for forming the flange portion and the press work for forming the projections. This can result in an improvement in the yield and a reduction of the costs. Moreover, placing these projections in contact with the outer circumference of the first flange portion 62B can facilitate the press work for forming the projections.

Figure 11:
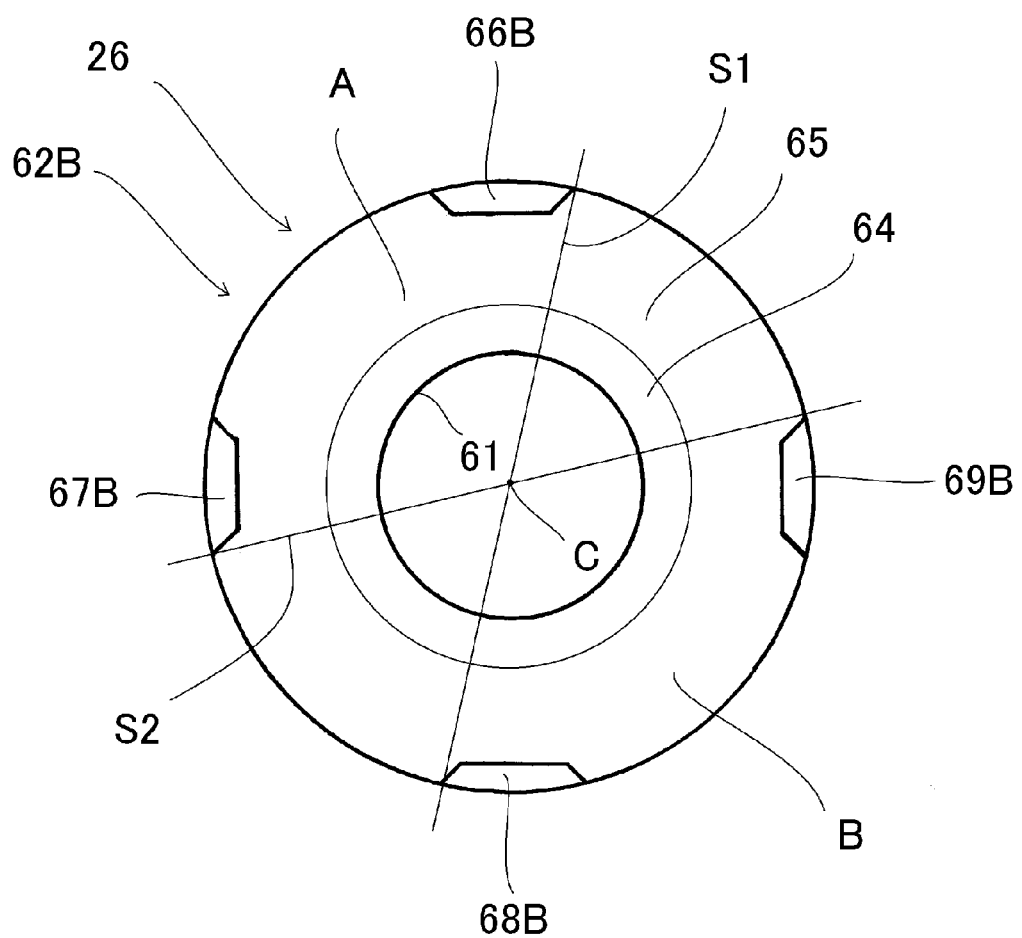
FIG. 11 is a plan view of the first flange portion of the tubular part shown in FIG. 10.

The arrangement of the first projection 66B, the second projection 67B, the third projection 68B, and the fourth projection 69B on the first flange portion 62B is now described more specifically with reference to FIG. 11. In the first flange portion 62B, a line segment that passes through the central axis C of the cylinder portion 61 and comes into contact with a point on the outline of the first projection 66B that is away from the second projection 67B is taken as a first line segment S1. A line segment that passes through the central axis C of the cylinder portion 61 and comes into contact with a point on the outline of the second projection 67B that is away from the first projection 66B is taken as a second line segment S2. The first line segment S1 is in contact with a point on the contour of the first projection 66B, and the second line segment S2 is in contact with a point on the contour of the second projection 67B. The first projection 66B and the second projection 67B are disposed in a region A sandwiched between the first line segment S1 and the second line segment S2. The third projection 68B is disposed in a region B that is sandwiched between the first line segment S1 and the second line segment S2 at the opposite side of the region A with the central axis C of the cylinder portion 61 therebetween. The regions A and B are located on the first flange portion 62B.

Because the first projection 66B and the second projection 67B are disposed in the region A and the third projection 68B is disposed in the region B, the tubular part 26 can be supported by the three points of the first projection 66B, the second projection 67B and the third projection 68B when the tubular part 26 is disposed on the circuit layer 2b using a jig prior to be bonded, improving the stability.

As long as the first projection 66B and the second projection 67B are disposed in the region A and the third projection 68B is disposed in the region B, the fourth projection 69B can be disposed anywhere on the flat portion 65 of the first flange portion 62B. In the tubular part 26 shown in FIG. 10, the fourth projection 69B is disposed in an arc on the outer circumference of the first flange portion 62B and between the first projection 66B and the third projection 68B.

The first projection 66B, the second projection 67B, the third projection 68B, and the fourth projection 69B are in the same size. Needless to say, the size of one or two of the four projections may be different from those of the other two or three, or all the four projections may be in different sizes.

The first projection 66B, the second projection 67B, the third projection 68B, and the fourth projection 69B have roughly the same square outline. Forming these projection into this same shape can facilitate designing and production of a press mold used for forming these projections. The outline of these projections is not limited to a square shape; thus, the projections may have any other outline. In addition, the shape of one or two of the four projections may be different from those of the other two or three, or all the four projections may be in different shapes.

In FIG. 10, the n of the nth projection is 4. However, even when the n is 5 or higher, the nth projection can be disposed anywhere on the flat portion 65 of the first flange portion 62B as long as the first projection and the second projection are disposed in the region A and the third projection that is defined as a projection other than the first and second projections is disposed in the region B. In addition, even when the n is 5 or higher, designing and production of a press mold used for forming the projections can be facilitated by forming the projections into the same shape.

In the tubular parts 6, 16 and 26 shown in FIGS. 6, 8 and 10, the first flange portions 62, 62A and 62B each are connected to one longitudinal end of the cylinder portion 61, and the second flange portion 63 is connected to the other longitudinal end. The second flange portion 63 is not bonded to the circuit layer of the insulated substrate 2 and is therefore not a necessary portion. Thus, each of the tubular parts can be configured as a tubular part that has the first flange portion 62, 62A, 62B but does not have the second flange portion 63. Needless to say, being provided with the second flange portion 63 can facilitate the insertion of the external terminal 7 and prevent the tubular part from rattling in the jig when placing the tubular part on the circuit layer 2b.

Furthermore, it is preferred that the tubular part be configured such that the second flange portion 63 has the projections according to the present disclosure that are the same as those of the first flange portions 62, 62A and 62B. The reason is because, since the shape of the first flange portions 62, 62A and 62B is not different from the shape of the second flange portion 63, it is not necessary to identify whether the flange portion to be opposed to the circuit layer 2b is any of the first flange portions 62, 62A and 62B when attaching the tubular part to the jig for placing the tubular part on circuit layer 2b, improving the workability for bonding the tubular part.

It is preferred that, in the second flange portion 63, projections of the same shape as the first projection, the second projection and the third projection of the first flange portion be disposed in positions that face the first projection, the second projection and the third projection, respectively. This is because such a configuration can facilitate designing and production of a press mold used for forming these projections. When the first flange portions 62, 62A and 62B each have the nth projection (n is an integer equal to or greater than 4), it is preferred that the nth projection (n is an integer equal to or greater than 4) be disposed in the second flange portion 63 in such a manner as to face the nth projection of the first flange portion.

Although embodiments have been shown and described, it would be appreciated by those skilled in the art that changes may be made in the embodiments without departing from the principles and spirit of the invention, the scope of which is defined in the claims and their equivalents.

Any identification in this disclosure of problems, deficiencies, or other characterizations of any product or method of the related art does not imply or admit that such problems, deficiencies, or other characterizations were known in the prior art even if the product or method itself was known in the prior art.

Reference Signs And Numerals Are As Follows

1 Power semiconductor module
2 Insulated substrate
3A, 3B, 3C, 3D Semiconductor chip
5 Bonding wire
6, 16, 26 Tubular part
7 External terminal
8 Case
9 Gel
61 Cylinder portion
62, 62A, 62B First flange portion
63 Second flange portion
64 Curved surface portion
65 Flat portion
66, 66A, 66B First projection
67, 67A, 67B Second projection
68, 68A, 68B Third projection

What is claimed is:
1. A semiconductor device, comprising:
an insulated substrate having a circuit layer on a front surface thereof;
a tubular part soldered to the circuit layer and having
a cylindrical portion having an inner diameter, and
a flange portion connected to one longitudinal end of the cylindrical portion, the flange portion having a first projection, a second projection, and a third projection each facing the circuit layer,
a shortest distance between the first projection and the second projection, a shortest distance between the second projection and the third projection, and a shortest distance between the third projection and the first projection each being greater than the inner diameter of the cylindrical portion; and
an external terminal inserted into the cylindrical portion of the tubular part and connected electrically to the tubular part.

2. The semiconductor device according to claim 1, wherein
the flange portion has
on an inner circumferential side thereof, a curved surface portion connected to the cylindrical portion, and,
on an outer circumferential side thereof, a disc-shaped flat portion connected to the curved surface portion, and
the first projection, the second projection, and the third projection are disposed on the disc-shaped flat portion and are not disposed on the curved surface portion.

3. The semiconductor device according to claim 2, wherein the first projection, the second projection, and the third projection are disposed on the flange portion so as to be in rotational symmetry with respect to a central axis of the cylindrical portion.

4. The semiconductor device according to claim 3, wherein
the first projection, the second projection, and the third projection are of a same shape, are each in contact with an outer circumference of the disc-shaped flat portion, and each have a substantially isosceles trapezoidal outline having a lower base in a form of an outer circumferential arc, and
a leg of the outline of the first projection is substantially parallel to a leg of the outline of the second projection.

5. The semiconductor device according to claim 4, wherein a length of the outer circumferential arc of the first projection is equal to or greater than 0.1 times the inner diameter of the cylindrical portion but equal to or less than twice the inner diameter of the cylindrical portion.

6. The semiconductor device according to claim 5, wherein
the flange portion is a first flange portion, and
the tubular part further has a second flange portion connected to the other longitudinal end of the cylindrical portion.

7. The semiconductor device according to claim 4, wherein
the flange portion is a first flange portion, and
the tubular part further has a second flange portion connected to the other longitudinal end of the cylindrical portion.

8. The semiconductor device according to claim 3, wherein
the flange portion is a first flange portion, and
the tubular part further has a second flange portion connected to the other longitudinal end of the cylindrical portion.

9. The semiconductor device according to claim 2, wherein
the first projection and the second projection are disposed in a first circular sector region between:
a first line segment that passes through a central axis of the cylindrical portion and is tangential to the outline of the first projection at a point on the outline of the first projection positioned away from the second projection, and
a second line segment that passes through the central axis of the cylindrical portion and is tangential to the outline of the second projection at a point on the outline of the second projection positioned away from the first projection, and
the third projection is disposed in a second circular sector region, between the first line segment and the second line segment, opposite to the first circular sector region with the central axis of the cylindrical portion therebetween.

10. The semiconductor device according to claim 9, wherein the first projection, the second projection, and the third projection are of the same shape.

11. The semiconductor device according to claim 10, wherein
the flange portion is a first flange portion, and
the tubular part further has a second flange portion connected to the other longitudinal end of the cylindrical portion.

12. The semiconductor device according to claim 9, wherein
the flange portion is a first flange portion, and
the tubular part further has a second flange portion connected to the other longitudinal end of the cylindrical portion.

13. The semiconductor device according to claim 9, wherein
the first flange portion has n projections, where n is an integer equal to or greater than 4, and
the first projection, the second projection and the third projection are among the n projections.

14. The semiconductor device according to claim 13, wherein the n projections are of a same shape.

15. The semiconductor device according to claim 14, wherein
the flange portion is a first flange portion, and
the tubular part further has a second flange portion connected to the other longitudinal end of the cylindrical portion.

16. The semiconductor device according to claim 15, wherein the second flange portion has:
further projections of same shapes as those of the first projection, the n projections and disposed at positions facing the n projections, respectively.

17. The semiconductor device according to claim 2, wherein
the flange portion is a first flange portion, and
the tubular part further has a second flange portion connected to the other longitudinal end of the cylindrical portion.

18. The semiconductor device according to claim 1, wherein
the flange portion is a first flange portion, and
the tubular part further has a second flange portion connected to the other longitudinal end of the cylindrical portion.

19. The semiconductor device according to claim 18, wherein the second flange portion has:
three projections of same shapes as those of the first projection, the second projection and the third projection and disposed at positions facing the first projection, the second projection and the third projection, respectively.

* * * * *